United States Patent
Lee et al.

(10) Patent No.: US 6,563,190 B1
(45) Date of Patent: May 13, 2003

(54) CAPACITOR ARRAY PREVENTING CROSSTALK BETWEEN ADJACENT CAPACITORS IN SEMICONDUCTOR DEVICE

(75) Inventors: Hae-jeong Lee, Kyungki-do (KR); Ho-kyu Kang, Kyungki-do (KR)

(73) Assignee: Samsung Electronics Co., Ltd, Suwon (KR)

(*) Notice: Subject to any disclaimer, the term of this patent is extended or adjusted under 35 U.S.C. 154(b) by 204 days.

(21) Appl. No.: 09/669,964

(22) Filed: Sep. 26, 2000

(30) Foreign Application Priority Data

Sep. 27, 1999 (KR) .............................................. 99-41312

(51) Int. Cl.[7] .............................................. H01L 29/00
(52) U.S. Cl. ...................... 257/532; 257/534; 257/309; 438/128; 438/381
(58) Field of Search ................................ 257/532, 534, 257/296, 309; 438/381, 128

(56) References Cited

U.S. PATENT DOCUMENTS

| 5,000,818 A | | 3/1991 | Thomas et al. ............. 156/643 |
| 5,461,003 A | * | 10/1995 | Havemann et al. ......... 438/619 |
| 6,150,232 A | * | 11/2000 | Chan et al. .................. 257/522 |
| 6,159,842 A | * | 12/2000 | Chang et al. .................. 216/2 |
| 6,187,624 B1 | * | 2/2001 | Huang ........................ 438/253 |

FOREIGN PATENT DOCUMENTS

| EP | 834916 | * | 4/1998 |
| JP | 06-302764 | | 10/1994 |

* cited by examiner

*Primary Examiner*—Trung Dang
(74) *Attorney, Agent, or Firm*—Volentine Francos, P.L.L.C.

(57) ABSTRACT

A capacitor array of a semiconductor device including a plurality of capacitors is provided. The capacitor array includes a plurality of lower electrodes, which are formed over a semiconductor substrate. A dielectric layer formed over the lower electrodes, and an upper electrode formed over the dielectric layer. The plurality of lower electrodes are insulated from each other either by an insulating layer having pores of a low dielectric constant, or by an air gap.

14 Claims, 5 Drawing Sheets

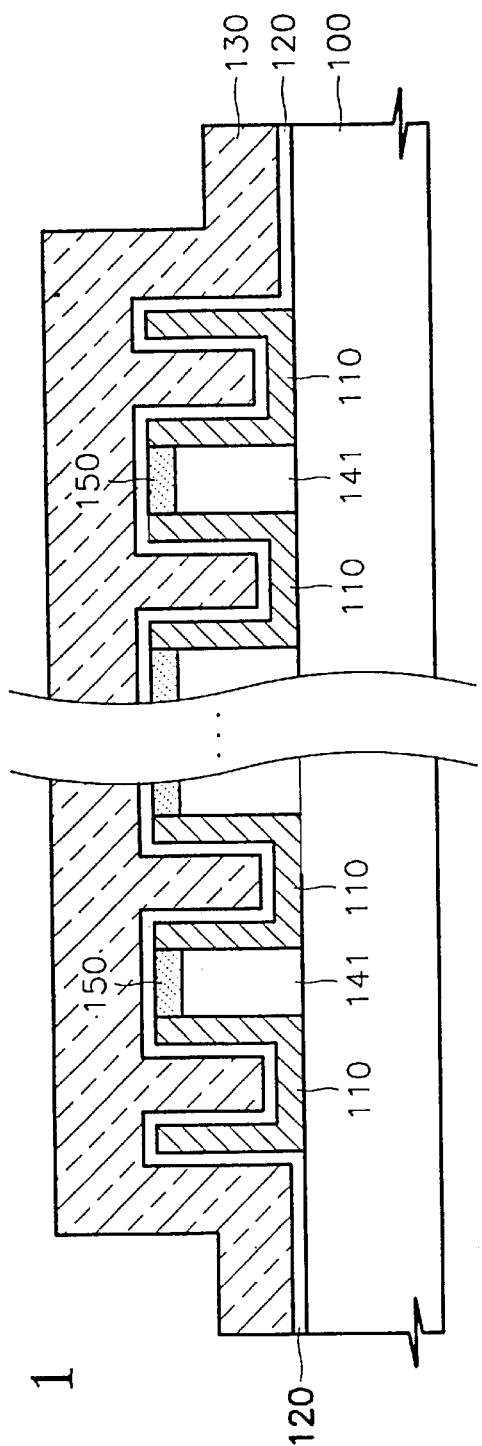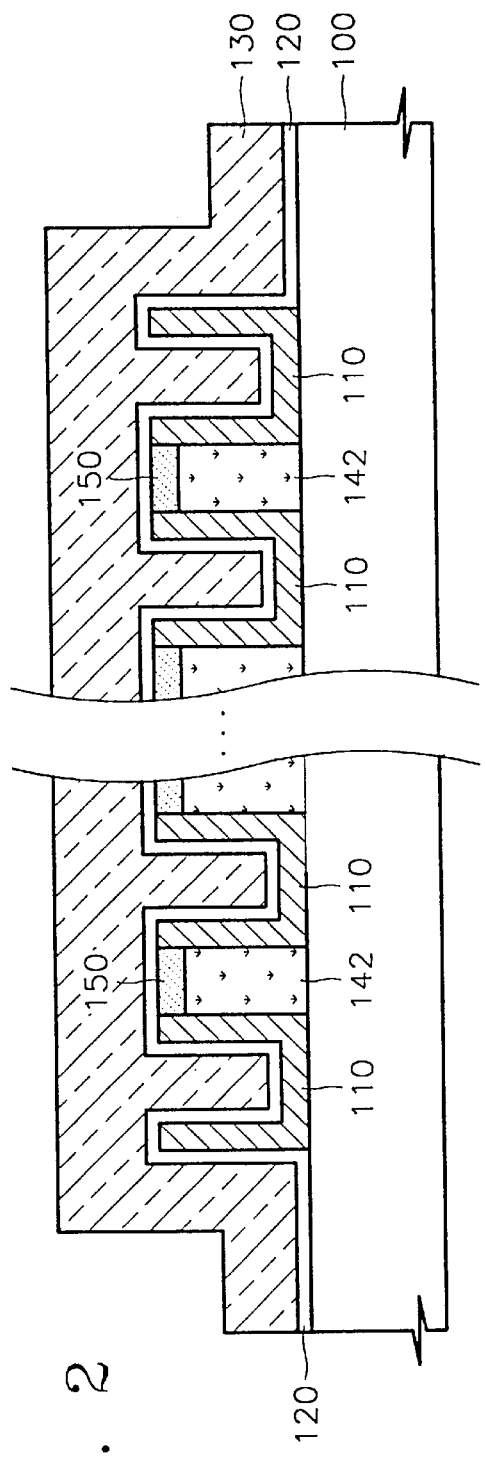

CAPACITOR ARRAY PREVENTING CROSSTALK BETWEEN ADJACENT CAPACITORS IN SEMICONDUCTOR DEVICE

BACKGROUND OF THE INVENTION

The present invention relates to a capacitor array of a semiconductor device having a plurality of capacitors and a method for fabricating the capacitor array. More particularly, the present invention relates to a capacitor array for preventing the crosstalk between adjacent capacitors in a semiconductor device and a method for fabricating the capacitor array.

As semiconductor devices have recently become more highly integrated, spacing between unit parts in semiconductor devices has greatly decreased. For example, a plurality of transistors and capacitors are included in a semiconductor memory device such as a dynamic random access memory (DRAM).

As the integration of the semiconductor memory device increases, spacing between the capacitors as well as between the gates of the transistors greatly decreases. This may cause various problems during operation, as well as during the fabrication of the semiconductor memory devices. For example, a decrease of the spacing between capacitors may disturb complete insulation between adjacent capacitors.

Moreover, crosstalk may sometimes occur between adjacent capacitors so that information cannot be accurately stored. Such crosstalk between adjacent capacitors greatly decreases the reliability of devices.

SUMMARY OF THE INVENTION

It is an objective of the present invention to provide a capacitor array including a plurality of capacitors that prevents crosstalk between adjacent capacitors during the operation of the device.

It is another objective of the present invention to provide a method for fabricating such a capacitor array.

To achieve the first objective, a capacitor array of a semiconductor device having a plurality of capacitors is provided. The capacitor array comprises a plurality of lower electrodes formed over a semiconductor substrate; one or more insulating layers formed between the adjacent lower electrodes, the insulating layers having pores of a low dielectric constant; a dielectric layer formed over the lower electrodes; and an upper electrode formed over the dielectric layer. The lower electrodes preferably each have a cylindrical shape. The insulating layers preferably comprise amorphous carbon, polyimide, or hybrid silicate-on-glass.

Alternately, a capacitor array of a semiconductor device having a plurality of capacitors may be provided. The capacitor array comprises a plurality of lower electrodes formed over a semiconductor substrate; one or more air gaps formed between the adjacent lower electrodes; a dielectric layer formed over the lower electrodes; and an upper electrode formed over the dielectric layer. The lower electrodes preferably each have a cylindrical shape.

To achieve the second objective, a method is provided for fabricating a capacitor array of a semiconductor device having a plurality of capacitors. The method comprises forming an insulating layer having a low dielectric constant over a semiconductor substrate; forming an etching stop layer over the insulating layer; forming a plurality of openings that expose a top surface of the semiconductor substrate at predetermined intervals by patterning the insulating layer and the etching stop layer; forming a lower electrode conductive layer over the etching stop layer and in the plurality of openings; removing a part of the lower electrode conductive layer to expose a surface of the etching stop layer, thereby forming a plurality of lower electrodes that are insulated from each other by the insulating layer; forming one or more air gaps between the plurality of lower electrodes by performing a heat treatment process at a predetermined temperature to remove the insulating layer from between the plurality of lower electrodes; forming a dielectric layer over the lower electrodes; and forming an upper electrode over the dielectric layer.

The insulating layer preferably comprises material that is completely thermally-decomposed at a temperature of 400° C. or less. More specifically, the insulating layer preferably comprises amorphous carbon, polyimide, or hybrid silicate-on-glass. The etching stop layer preferably comprises a $Si_3N_4$ layer or a SiON layer. The lower electrodes are preferably each formed to have a cylindrical shape.

The method may further comprise forming a protective layer over the lower electrode conductive layer, within the openings, before removing a part of the lower electrode conductive layer; and removing the protective layer after forming the lower electrodes.

The protective layer is preferably formed by deposition of an oxide layer using a chemical vapor deposition method or a spin-on-glass method. The protective layer is preferably removed by a wet etching method. The removing of a part of the lower electrode conductive layer is preferably accomplished using a chemical-mechanical polishing process or an etch back process.

An alternate method for fabricating a capacitor array of a semiconductor device having a plurality of capacitors may also be provided. The method comprises forming an insulating layer having a low dielectric constant over a semiconductor substrate; forming an etching stop layer over the insulating layer; forming a plurality of openings that expose a top surface of the semiconductor substrate at predetermined intervals by patterning the insulating layer and the etching stop layer; forming a lower electrode conductive layer over the etching stop layer and in the openings; removing a part of the lower electrode conductive layer to expose a top surface of the etching stop layer, thereby forming lower electrodes that are insulated from each other by the insulating layer; forming pores in the insulating layer by performing a heat treatment process at a predetermined temperature; forming a dielectric layer over the lower electrodes; and forming an upper electrode over the dielectric layer.

The insulating layer preferably comprises a material that is partially thermally-decomposed at a temperature of 400° C. or less. More specifically, the insulating layer preferably comprises amorphous carbon, polyimide, or hybrid silicate-on-glass. The etching stop layer preferably comprises a $Si_3N_4$ layer or a SiON layer. The lower electrodes are preferably each formed to have a cylindrical shape.

The method may further comprise forming a protective layer over the lower electrode conductive layer within the openings before removing a part of the lower electrode conductive layer; and removing the protective layer after forming the lower electrodes.

The protective layer is preferably formed by the deposition of an oxide layer using a chemical vapor deposition method or a spin-on-glass method. The protective layer is preferably removed by a wet etching method. The removing of a part of the lower electrode conductive layer is preferably accomplished by using a chemical-mechanical polishing process or an etch back process.

BRIEF DESCRIPTION OF THE DRAWINGS

The above objectives and advantages of the present invention will become more apparent by describing in detail preferred embodiments thereof with reference to the attached drawings in which:

FIG. 1 is a sectional view showing a capacitor array of a semiconductor device according to a first preferred embodiment of the present invention;

FIG. 2 is a sectional view showing a capacitor array of a semiconductor device according to a second preferred embodiment of the present invention.

DETAILED DESCRIPTION OF THE INVENTION

Figure 3:
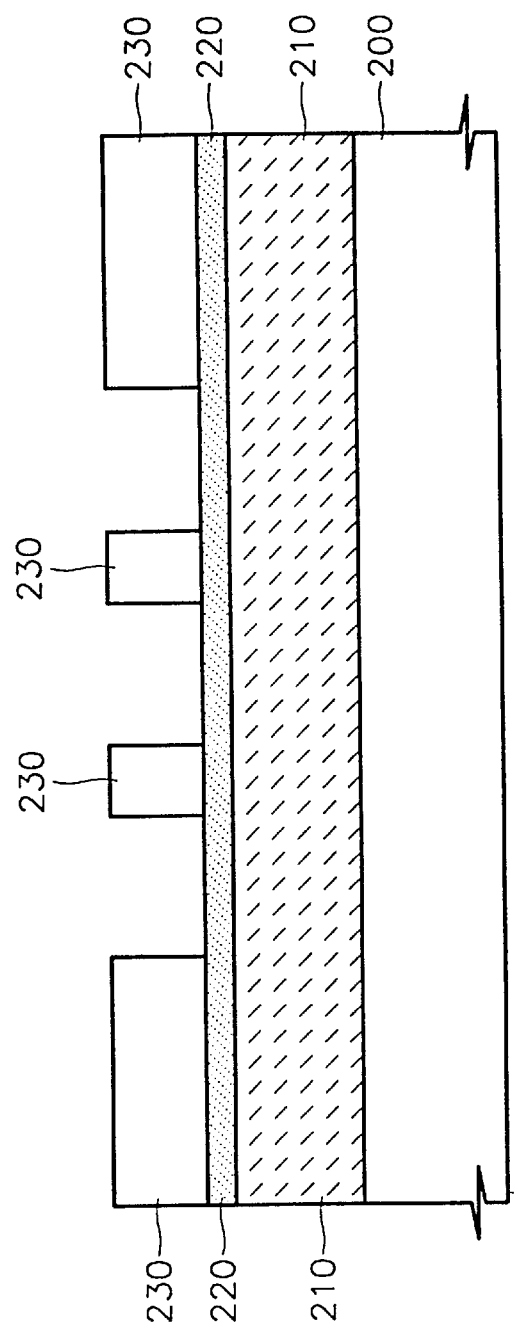
FIGS. 3 through 9 are sectional views for explaining a method for fabricating a capacitor array of a semiconductor device according to the preferred embodiments of the present invention.

The present invention will now be described in greater detail with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art.

FIG. 1 is a sectional view showing a capacitor array of a semiconductor device according to a first preferred embodiment of the present invention. Referring to FIG. 1, in this embodiment, a plurality of capacitors are formed over a semiconductor substrate 100. Although only four capacitors are shown in this drawing, more capacitors may be formed in practice.

Each capacitor includes a lower electrode 110, a dielectric layer 120, and an upper electrode 130. A plurality of lower electrodes 110 are individually formed for the individual capacitors. However, the dielectric layer 120 and the upper electrode 130 are preferably common to all of the capacitors. Preferably, each of the lower electrodes 110 is formed to have a cylindrical shape.

In addition, in the first preferred embodiment adjacent lower electrodes 110 are preferably insulated from each other by an air gap 141. The air gap 141, which is an empty space in which only air exist, is defined by the top surface of the substrate 100, the outer sidewalls of the lower electrodes 110 and the bottom surface of an etching stop layer 150. As is well known, air has a very low dielectric constant so that the capacitors can each be completely insulated from adjacent capacitors by the air gaps 141. Accordingly, this can eliminate crosstalk between adjacent capacitors during the operation of devices, and thereby enhance the reliability of such devices.

FIG. 2 is a sectional view showing a capacitor array of a semiconductor device according to a second preferred embodiment of the present invention. The same reference numerals in FIGS. 1 and 2 represent the same elements, and thus their description will not be repeated.

Referring to FIG. 2, each lower electrode 110 is insulated from an adjacent lower electrode 110 by an insulating layer 142. The air gap 141 previously described in FIG. 1 is most effective in suppressing the crosstalk between adjacent capacitors, but it does not have the supporting power of a solid material. As a result, in the first preferred embodiment, the upper electrode 130 may sink into the air gap 141.

However, in the second preferred embodiment, an insulating layer 142 having a low dielectric constant is used to insulate adjacent capacitors. This maintains the stability of the device as well as suppressing crosstalk between adjacent capacitors. The low dielectric constant insulating layer 142 is preferably formed of amorphous carbon, polyimide, or hybrid silicate-on-glass (SOG).

Sometimes, however, the suppression of crosstalk is more important than the stability of a device. In this case, a porous insulating layer can be used as the low dielectric constant insulating layer 142. In this case, pores, which have a very low dielectric constant, are formed in the insulating layer 142, thereby achieving better insulation between adjacent capacitors.

FIGS. 3 through 9 are sectional views for explaining a method for fabricating a capacitor array of a semiconductor device according to preferred embodiments of the present invention. Although FIGS. 3 through 9 show a method for fabricating a capacitor array in which adjacent capacitors are insulated by an air gap, it is obvious that the same fabrication method could also be applied when an insulating layer having a low dielectric constant or an insulating layer having pores and a low dielectric constant is used instead of an air gap.

Referring to FIG. 3, an insulating layer 210 having a low dielectric constant is formed over a semiconductor substrate 200. The insulating layer 210 is preferably formed of material that can be completely decomposed and removed at a certain temperature, for example, at a temperature of 400° C. or less. Any material, such as amorphous carbon, polyimide, or hybrid SOG, which is formed by a chemical vapor deposition method or a spin-on-glass method, can be used as the material that can completely be decomposed and removed at the temperature of 400° C. or less.

Subsequently, an etching stop layer 220 is formed over the insulating layer 210. The etching stop layer 220 serves as the end point of etching during a subsequent etching process and is preferably formed of $Si_3N_4$ or SiON. Thereafter, a photoresist layer is deposited over the etching stop layer 220. Exposure and development are then performed by a typical lithography method, thereby forming a photoresist layer pattern 230. The photoresist layer pattern 230 has openings exposing the surface of the etching stop layer 220 at predetermined intervals.

Figure 4:
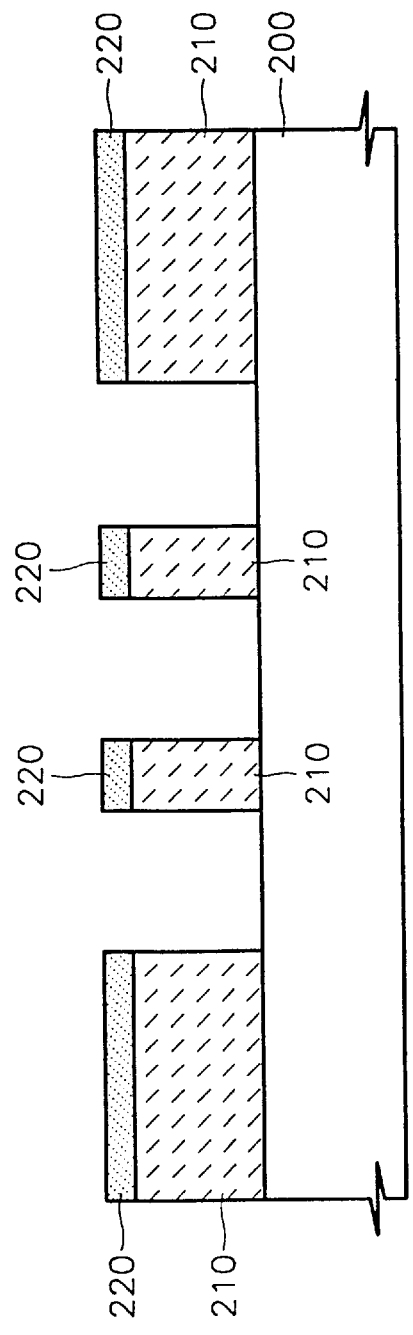

Referring to FIG. 4, exposed portions of the etching stop layer 220 and the insulating layer 210 are removed by performing an etching process using the photoresist layer pattern 230 as an etching mask, thereby forming openings, which expose the surface of the semiconductor substrate 200 at predetermined intervals. After forming the openings, the photoresist layer pattern 230 is then removed.

Figure 5:
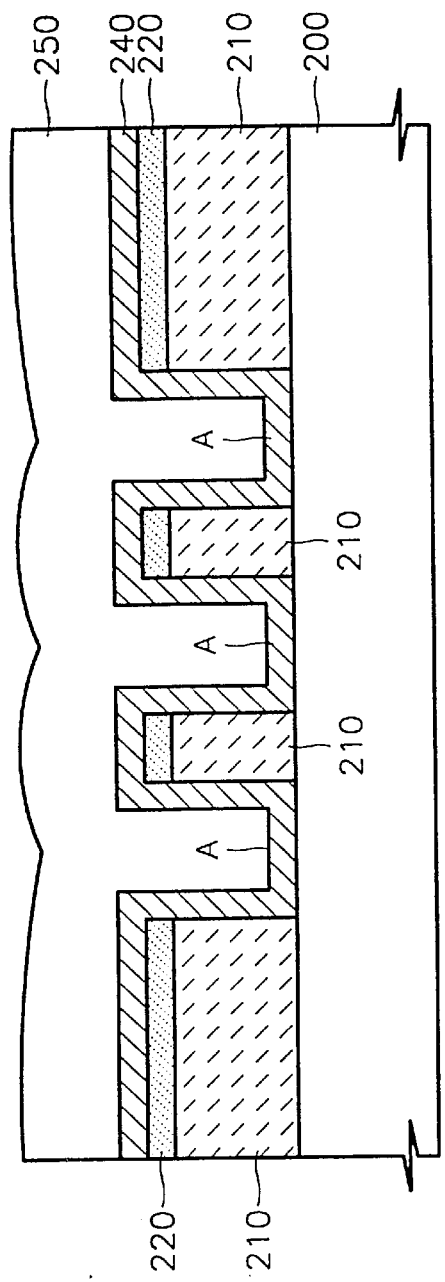

Referring to FIG. 5, a conductive layer that will form the lower electrodes, for example, a polysilicon layer 240, is formed over the entire surface of the resultant structure of FIG. 4. The polysilicon layer 240 may be formed by a chemical vapor deposition method.

After forming the polysilicon layer 240, a protective layer 250 is formed over the entire surface of the resultant structure. The protective layer 250 is formed to protect the bottom A of the polysilicon layer 240 from etching during the subsequent process of removing the polysilicon layer 240. The protective layer 250 is preferably formed of an oxide. The protective layer 250 may be formed by a chemical vapor deposition method or a spin-on-glass method.

Figure 6:
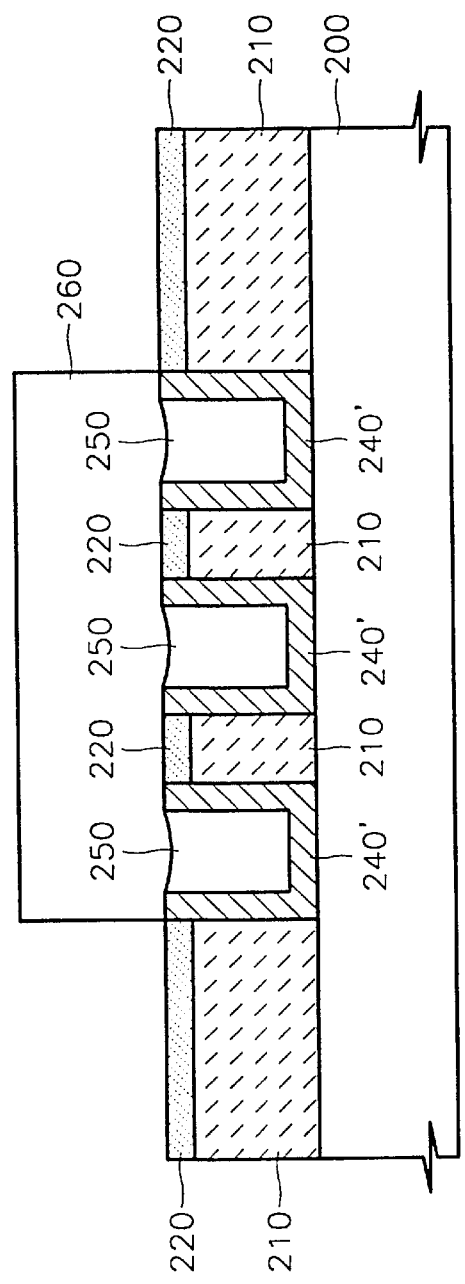

Referring to FIG. 6, a chemical-mechanical polishing process or an etch back process is performed to remove portions of the protective layer 250 and the polysilicon layer 240 of FIG. 5. The chemical-mechanical polishing process or the etch back process is preferably performed until the surface of the etching stop layer 220 is exposed. As a result of this, portions of the polysilicon layer 240 formed above the etching stop layer 220 are removed, thereby forming lower electrodes 240', which are separated from each other by portions of the insulating layer 210 and the etching stop layer 220. Subsequently, to remove the etching stop layer 220 and the insulating layer 210 in a peripheral circuit area, a photoresist layer pattern 260 is formed that exposes the peripheral circuit area.

Figure 7:
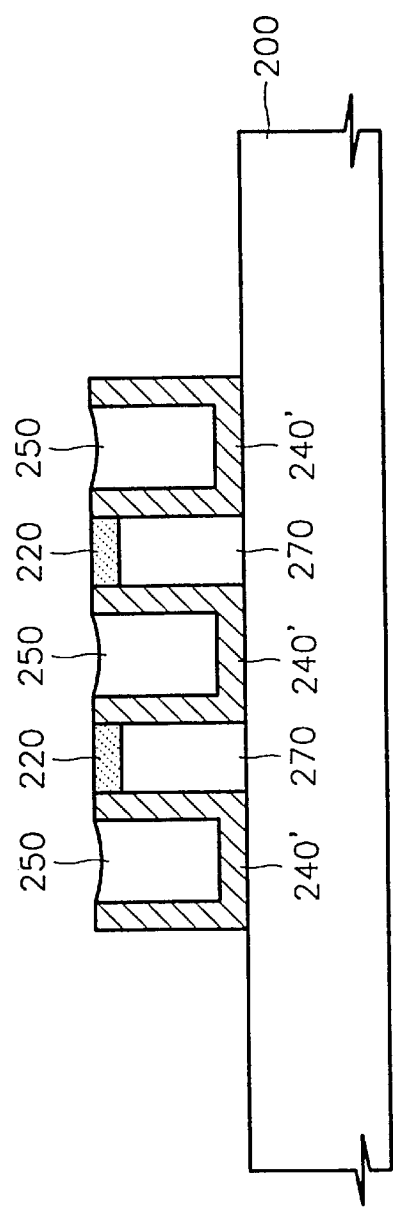

Referring to FIG. 7, the etching stop layer 220 and the insulating layer 210 in the peripheral circuit area are removed by performing an etching process using the photoresist layer pattern 260 of FIG. 6 as an etching mask. As a result of this, the surface of the semiconductor substrate 200 is exposed in the peripheral circuit area.

Subsequently, the photoresist layer pattern 260 is removed. After removing the photoresist layer pattern 260, a heat treatment process is performed at a predetermined temperature, for example, a temperature of 400° C. or less. The heat treatment process is performed until remaining portions of the insulating layer 210 are completely removed. Thus, the insulating layer 210 is thermally decomposed and discharged in the form of a gas, thereby forming air gaps 270 that replace the insulating layer 210.

In alternate embodiments, the insulating layer 210 can be retained between the electrodes 240'. In addition, when the insulating layer 210 is formed of a material that can be partially decomposed at a temperature of 400° C. or less, an insulating layer having pores is formed instead of the air gaps 270 as the result of performing the heat treatment process.

Figure 8:
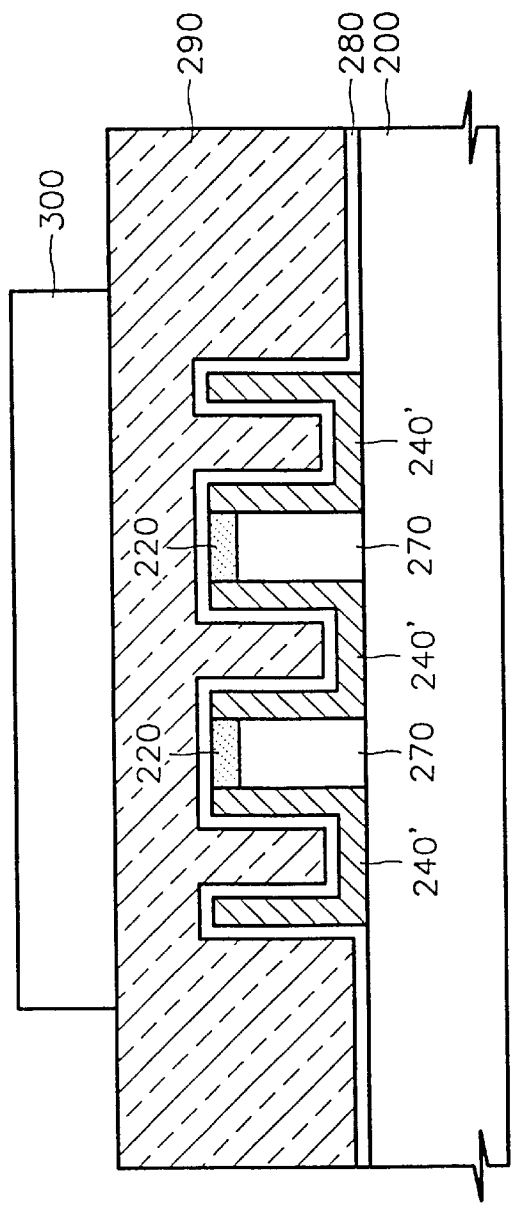

Referring to FIG. 8, the protective layer 250 of FIG. 7 is removed, preferably by a wet etching method, thereby completing a lower electrode 240' having a cylindrical shape. Subsequently, a dielectric layer 280 is deposited over the entire surface of the resultant structure, and an upper electrode conductive layer 290 is then deposited over the dielectric layer 280.

Figure 9:
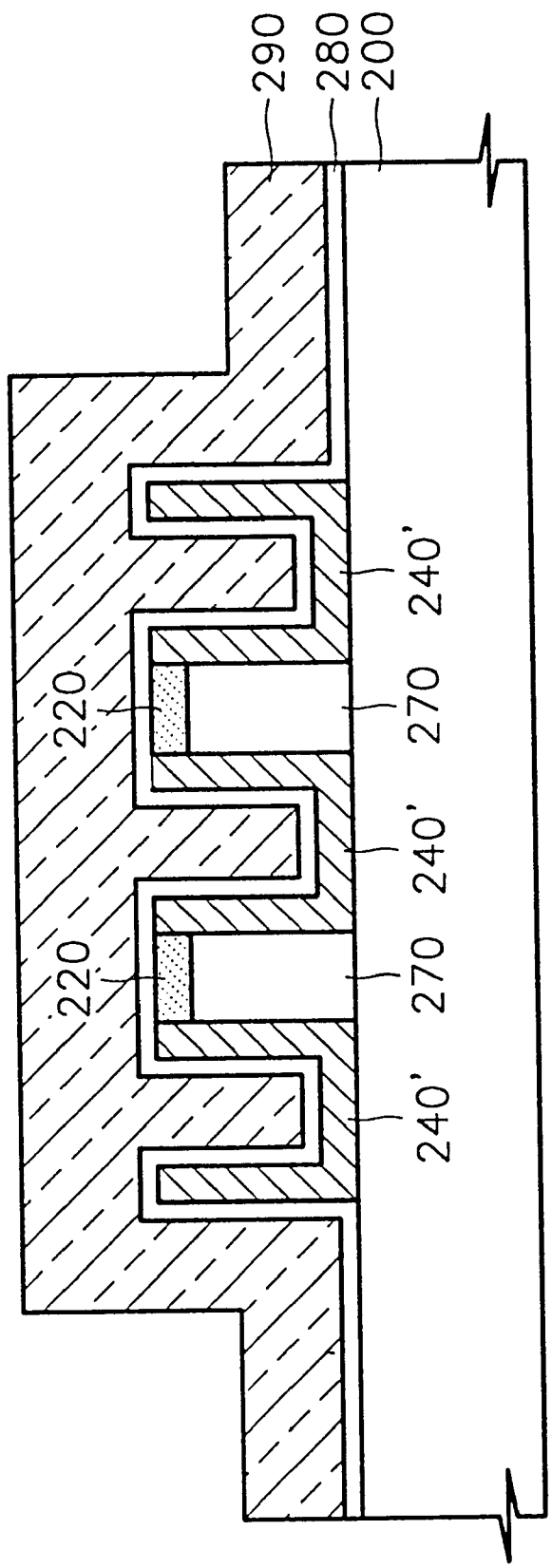

Then, a photoresist layer pattern 300 that exposes the peripheral circuit area is formed over the upper electrode conductive layer 290. The upper electrode conductive layer 290 is then patterned by performing an etching process using the photoresist layer pattern 300 as an etching mask. As a result of this etching, a capacitor array of a semiconductor device according to preferred embodiments of the present invention is completed as shown in FIG. 9.

While this invention has been particularly shown and described with reference to preferred embodiments thereof, it will be understood by those skilled in the art that various changes in form and details may be made therein without departing from the spirit and scope of the invention as defined by the appended claims. For example, the heat treatment process for forming the air gaps 270 of FIG. 7 may be performed either before or after the protective layer 250 of FIG. 7 is completely removed as described above. Similarly, the heat treatment process may be performed in another step.

In a capacitor array of a semiconductor device and a method for fabricating the capacitor array according to the present invention, the capacitor array including a plurality of capacitors has an insulating layer having a low dielectric constant. For example, an insulating layer having pores or an air gap is formed between adjacent capacitors, thereby suppressing the crosstalk between these adjacent capacitors. This improves the reliability of devices.

What is claimed is:

1. A capacitor array of a semiconductor device having a plurality of capacitors, the capacitor array comprising:
    a plurality of lower electrodes formed over a semiconductor substrate;
    one or more insulating layers formed between the adjacent lower electrodes, the insulating layers having pores of a low dielectric constant;
    an etch stopping layer disposed on the one or more insulating layers;
    a dielectric layer formed over the lower electrodes; and
    an upper electrode formed over the dielectric layer.

2. A capacitor array, as recited in claim 1, wherein the lower electrodes each have a cylindrical shape.

3. The capacitor array of claim 1, wherein the insulating layers comprise amorphous carbon, polyimide or spin-on-glass.

4. A capacitor array of a semiconductor device having a plurality of capacitors, the capacitor array comprising:
    a plurality of lower electrodes formed over a semiconductor substrate;
    one or more airgaps formed between the adjacent lower electrodes;
    a dielectric layer formed over the lower electrodes; and
    an upper electrode formed over the dielectric layer.

5. A capacitor array, as recited in claim 4, wherein the lower electrodes each have a cylindrical shape.

6. The capacitor array of claim 1, wherein the dielectric layer is also formed on the etch stopping layer.

7. The capacitor array of claim 1, wherein the etch stopping layer comprises one of $Si_3N_4$ and SiON.

8. The capacitor array of claim 4, further comprising an etch stopping layer disposed above the one or more air gaps.

9. The capacitor array of claim 8, wherein the etch stopping layer comprises one of $Si_3N_4$ and SiON.

10. The capacitor array of claim 8, wherein the dielectric layer is also formed on the etch stopping layer.

11. A capacitor array of a semiconductor device having a plurality of capacitors, comprising:
    a plurality of lower electrodes disposed on a semiconductor substrate;
    a dielectric layer disposed on the plurality of lower electrodes;
    an upper electrode disposed on the dielectric layer; and
    at least one air gap disposed on the substrate, said air gap extending completely between two of the plurality of lower electrodes.

12. The capacitor array of claim 11, further comprising an etch stopping layer disposed above the air gap and also extending completely between said two lower electrodes.

13. The capacitor array of claim 12, wherein the etch stopping layer comprises one of $Si_3N_4$ and SiON.

14. The capacitor array of claim 12, wherein the dielectric layer is also formed on the etch stopping layer.

* * * * *